(12) United States Patent
Koyama et al.

(10) Patent No.: US 8,242,856 B2
(45) Date of Patent: Aug. 14, 2012

(54) PIEZOELECTRIC OSCILLATOR

(75) Inventors: Mitsuaki Koyama, Sayama (JP); Shigetaka Kaga, Sayama (JP); Kazuo Akaike, Sayama (JP); Shigenori Watanabe, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/927,888

(22) Filed: Nov. 29, 2010

(65) Prior Publication Data

US 2011/0156823 A1    Jun. 30, 2011

(30) Foreign Application Priority Data

Dec. 24, 2009  (JP) ................................. 2009-293081

(51) Int. Cl.
*H03B 5/32* (2006.01)
(52) U.S. Cl. .............. 331/158; 331/116 R; 331/116 FE; 331/176
(58) Field of Classification Search .................. 331/158, 331/176, 116 R, 116 FE
See application file for complete search history.

(56) References Cited

U.S. PATENT DOCUMENTS 8,085,105 B2 * 12/2011 Kasahara ...................... 331/176

FOREIGN PATENT DOCUMENTS

| JP | 57-168515 | 10/1982 |
|---|---|---|
| JP | 2-065510 | 3/1990 |
| JP | 2-174407 | 7/1990 |
| JP | 3-252204 | 11/1991 |
| JP | 4-068903 | 3/1992 |
| JP | 6-021741 | 1/1994 |
| JP | 7-190916 | 7/1995 |
| JP | 2008-066799 | 3/2008 |

* cited by examiner

*Primary Examiner* — Arnold Kinkead
(74) *Attorney, Agent, or Firm* — Jordan and Hamburg LLP

(57) ABSTRACT

There is provided a temperature compensated piezoelectric oscillator which excels in frequency stability and has a good electronic noise characteristic, and with which a circuit can be structured simply. An auxiliary oscillator unit 21 sharing a crystal substrate 2 with a main oscillator unit 11 outputting a set frequency $f_0$ to an outside is used as a temperature detecting unit 32 detecting a temperature T for obtaining a compensation voltage $\Delta V$ in a temperature compensated piezoelectric oscillator (TCXO), and electrodes 13, 23 of the main oscillator unit 11 and the auxiliary oscillator unit 21 are provided separately on the crystal substrate 2. For example, a fundamental wave and an overtone are used or a thickness shear vibration and a contour shear vibration are used in the main oscillator unit 11 and the auxiliary oscillator unit 21, respectively.

15 Claims, 18 Drawing Sheets

(a)

(b)

(a)

(b)

(a)

(b)

(c)

(a)

(b)

(c)

PIEZOELECTRIC OSCILLATOR

BACKGROUND OF THE INVENTION

1. Field of the Invention

The present invention relates to a piezoelectric oscillator which outputs a temperature-compensated frequency signal.

2. Description of the Related Art

A crystal resonator, which is a piezoelectric resonator used for a piezoelectric oscillator circuit, for example a crystal oscillator circuit, has frequency-temperature characteristics such that an oscillation frequency varies depending on temperatures. These frequency-temperature characteristics are different among crystal resonators due to cutting angles and thicknesses of crystal pieces constituting the crystal resonators. FIG. 6 illustrates an example of characteristics obtained by a crystal resonator using, for example, an AT-cut crystal piece with respect to such frequency-temperature characteristics. In FIG. 6, the vertical axis of the graph shows a frequency deviation ($\Delta f/f_0$, $\Delta f = f - f_0$) between a set frequency $f_0$ as a target (at which oscillation is desired) and a frequency $f$ actually obtained at a temperature T, and the horizontal axis shows the temperature T of the crystal resonator. Symbol $T_0$ denotes a reference temperature, for example 29° C., and a control voltage of the oscillator circuit is set so that the set frequency $f_0$ is obtained at this temperature $T_0$. When oscillation in a thickness shear vibration mode is generated using the AT-cut crystal piece, the frequency deviation $\Delta f/f_0$ is approximated by equation (1) which is a cubic function of the temperature T.

$$\Delta f/f_0 = \alpha(T-T_0)^3 + \beta(T-T_0) + \gamma \quad (1)$$

In this equation (1), symbols $\alpha$, $\beta$, and $\gamma$ denote constants obtained separately for each crystal resonator, and these constants ($\alpha$, $\beta$, $\gamma$, $T_0$, and $f_0$) are obtained by placing the crystal resonator in a thermostatic oven, measuring the frequency $f$ while varying the temperature T, and solving a simultaneous equation obtained by substituting measurement results of the temperature T and the frequency $f$ in equation (1).

Thus, various contrivances are made to stabilize the frequency irrespective of the atmospheric temperature. For example, in a temperature compensated xtal oscillator (TCXO), a control voltage and an output frequency are in a linear relation, and so temperature compensation is performed by providing a temperature sensor, for example a thermistor, in the package of the oscillator, obtaining a compensation voltage based on a temperature detection value from this temperature sensor and a reference temperature, and adding this compensation voltage to a reference voltage (control voltage by which the set frequency $f_0$ can be obtained at the reference temperature $T_0$). However, it is said that in this TCXO, the stability of the frequency-temperature characteristics of the crystal resonator after compensation (adjustment) is, for example, about ±0.2 ppm at the maximum in the temperature range of −20° C. to 75° C., and further improvement in stability is difficult.

On the other hand, as an oscillator that compensates the frequency-temperature characteristics of the crystal resonator besides the above-described TCXO, a D-TCXO (Digital-Temperature Compensated Xtal Oscillator) is known for example. In this D-TCXO, the control voltage V is adjusted by digital control. So, it is conceivable that the stability of the frequency-temperature characteristics can be improved more than by the above-described TCXO, but electronic noise is generated more than in the TCXO.

There is also known an OCXO (Oven Compensated Xtal Oscillator) which controls the frequency-temperature characteristics of the crystal resonator in an analog manner using an oven (thermostatic oven). In this OCXO, the stability of the frequency-temperature characteristics and an electronic noise characteristic are improved more than in the TCXO, but large power is consumed, which makes it expensive.

Further, there is also known an MCXO (Microcomputer Compensated Xtal Oscillator) in which, for example, a signal in a thickness shear vibration mode and a signal in a thickness twist vibration mode, which occur in a pair of electrodes formed on one face of an SC-cut crystal piece, are separated with a filter, the signal in the thickness shear vibration mode is taken out as a main oscillation (set frequency $f_0$), a temperature is detected from the signal of the thickness twist vibration mode, and the frequency-temperature characteristics (control voltage) of the crystal oscillator are controlled using a microcomputer based on this temperature. In this MCXO, the stability of the frequency-temperature characteristics and the electronic noise characteristic can be improved more than in the TCXO. However, since the signals in the two modes are separated with the filter, the circuit structure is complicated and consumes large power, which makes it expensive.

Japanese Patent Application Laid-open No. H7-190916 describes an odorous substance sensor in which one piezoelectric resonator plate is sectioned into plural vibration areas with slits, a pair of electrodes are disposed in each of the vibration areas, and plural odorous substances are recognized by absorbing odorous substances in a synthetic resin film applied on these electrodes. However, the above-described problems are not considered.

SUMMARY OF THE INVENTION

The present invention is made in view of such problems, and it is an object of the present invention to provide a piezoelectric oscillator which excels in frequency stability.

A piezoelectric oscillator of the present invention includes:

a main oscillator unit for outputting a set frequency signal, the main oscillator unit including a piezoelectric resonator formed by providing a main electrode for forming a main vibration area on a piezoelectric substrate, and a main oscillator circuit connected to the main electrode;

an auxiliary oscillator unit used as a temperature sensor, the auxiliary oscillator unit including a piezoelectric resonator formed by providing an auxiliary electrode for forming an auxiliary vibration area on the piezoelectric substrate used for the main oscillator unit separately from the main electrode, the piezoelectric resonator sharing the piezoelectric substrate with the piezoelectric resonator of the main oscillator unit, and an auxiliary oscillator circuit connected to the auxiliary electrode;

a temperature estimating unit detecting a frequency of an oscillation output of the auxiliary oscillator unit and estimating a temperature based on the frequency and a temperature characteristic of a frequency of the auxiliary oscillator unit; and a control voltage supply unit obtaining a control voltage for obtaining the set frequency signal based on the temperature estimated by the temperature estimating unit and a temperature characteristic of a frequency of the main oscillator unit and supplying the control voltage to the main oscillator circuit.

Preferably, a vibration wave used in the auxiliary oscillator unit is an overtone. A vibration mode of the auxiliary oscillator unit may be contour shear vibration.

Preferably, a vibration mode of the main oscillator unit is thickness shear vibration. Preferably, a vibration wave used in the main oscillator unit is an overtone.

The auxiliary oscillator unit may include a first auxiliary electrode forming a first auxiliary vibration area, a second auxiliary electrode forming a second auxiliary vibration area, a first auxiliary oscillator circuit and a second auxiliary oscillator circuit connected to the first auxiliary electrode and the second auxiliary electrode, respectively, and a unit for obtaining a difference or a sum of respective oscillation frequencies of the first auxiliary oscillator circuit and the second auxiliary oscillator circuit so as to obtain an oscillation output of the auxiliary oscillator unit. Preferably, the auxiliary electrode is larger in weight than the main electrode.

Preferably, the control voltage supply unit obtains a temperature compensation voltage with respect to a reference voltage which is a control voltage with which the main oscillator unit outputs a set frequency at a reference temperature, and adds the reference voltage and the temperature compensation voltage to obtain a control voltage.

In the present invention, the auxiliary oscillator unit sharing the piezoelectric substrate used for the main oscillator unit and including the auxiliary electrode different from the main electrode of the main oscillator unit on the piezoelectric substrate is provided separately from the main oscillator unit outputting a set frequency, a temperature is detected using this auxiliary oscillator unit as a temperature sensor, and a control voltage is compensated based on this temperature. Accordingly, the temperature itself of the main oscillator unit is substantially measured to compensate a temperature, and thus a temperature compensated piezoelectric oscillator which excels in frequency stability can be obtained.

DETAILED DESCRIPTION OF THE PREFERRED EMBODIMENTS

First Embodiment

Figure 1:
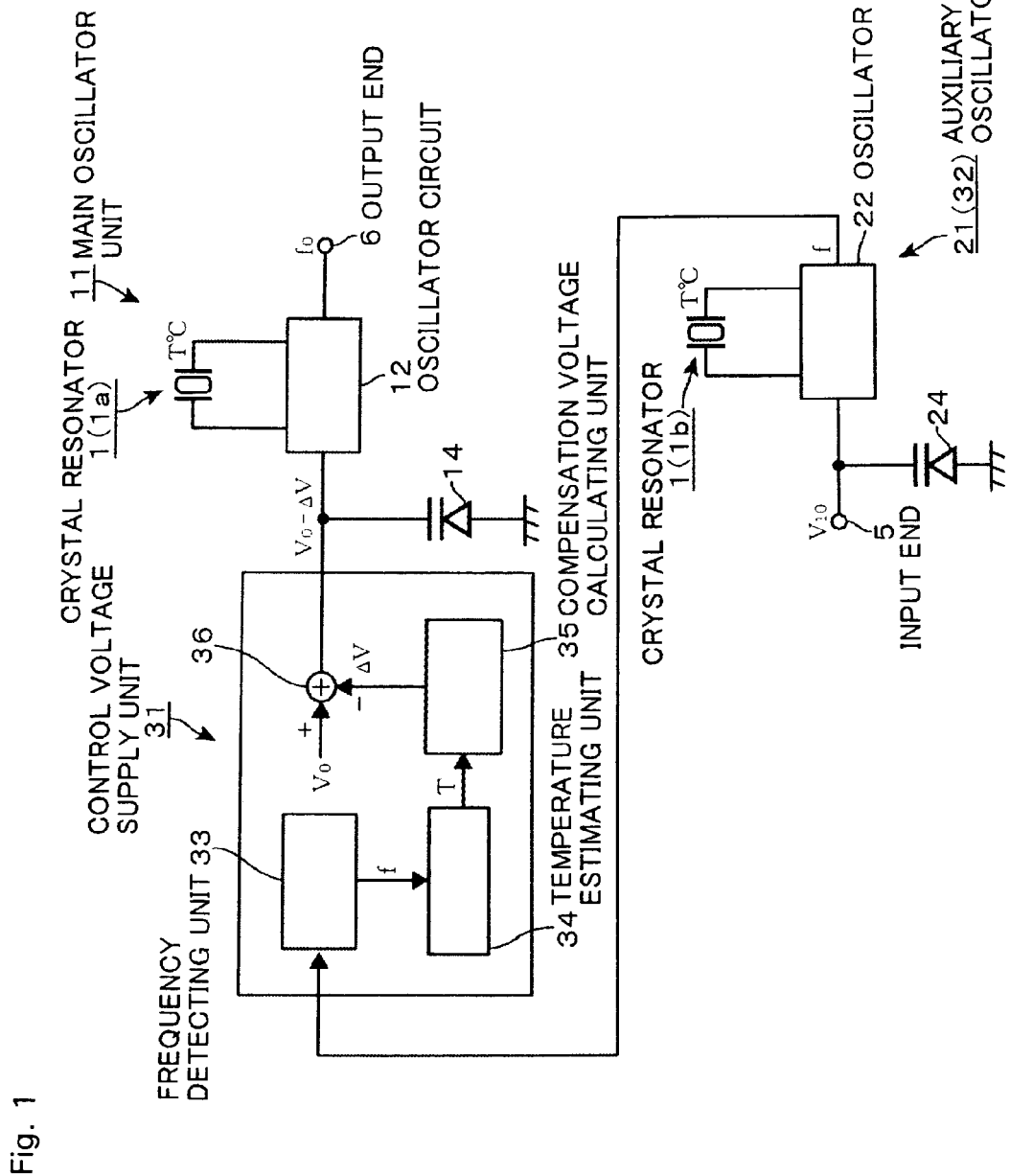
FIG. 1 is a circuit diagram illustrating an example of a TCXO of the present invention.

A first embodiment of a temperature compensated xtal oscillator (TCXO) which is a temperature compensated piezoelectric oscillator of the present invention will be described with reference to FIG. 1 to FIG. 5(a) and FIG. 5(b). First, a circuit structure of the TCXO is illustrated in FIG. 1. This TCXO includes a main oscillator unit 11 for outputting a signal of a set frequency $f_0$ to the outside, an auxiliary oscillator unit 21 for oscillating a signal for temperature compensation, and a control voltage supply unit 31 provided between the main oscillator unit 11 and the auxiliary oscillator unit 21 for calculating a control voltage $V_c$ to be inputted to the main oscillator unit 11 based on the signal for temperature compensation which is outputted from the auxiliary oscillator unit 21. Numeral 5 in FIG. 1 denotes an input end for a control voltage $V_{10}$ of the auxiliary oscillator unit 21, and this control voltage $V_{10}$ is inputted to the input end 5 by a not-illustrated voltage supply unit. Further, numeral 6 denotes an output end of the crystal oscillator according to this embodiment.

Figure 2:
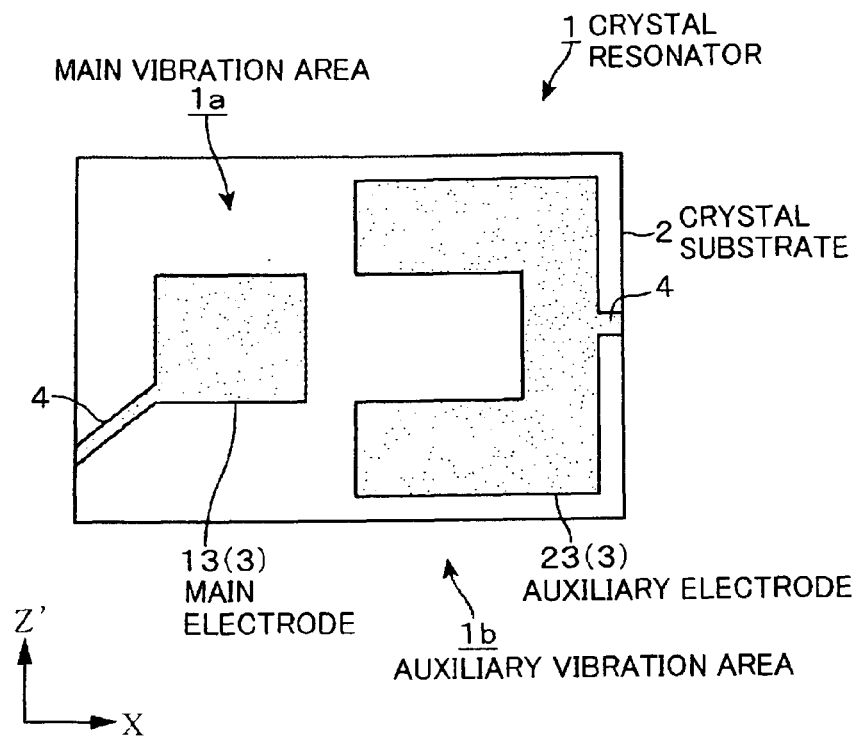
FIG. 2 is a plan view illustrating a crystal resonator of the TCXO.
Figure 3:
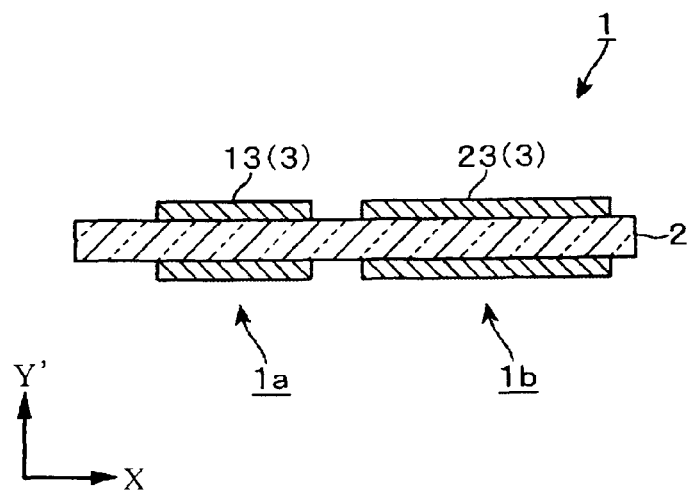
FIG. 3 is a side cross-sectional view illustrating the crystal resonator of the TCXO.

The main oscillator unit 11 includes a crystal resonator 1 which is a piezoelectric resonator, and a main oscillator circuit 12 connected to this crystal resonator 1. The crystal resonator 1 is constituted of, as illustrated in FIG. 2 and FIG. 3 for example, excitation electrodes 3 formed of stacked films of Cu (copper) and Au (gold), where the Cu film is on a base side, on both faces of, for example, an AT-cut crystal substrate (piezoelectric substrate) 2. Each excitation electrode 3 includes a main electrode 13 connected to the main oscillator circuit 12, and an auxiliary electrode 23 connected to an auxiliary oscillator circuit 22, which will be described later. In this example, the excitation electrodes 3 are formed to oppose each other via the crystal substrate 2 on an upper face and a lower face of the crystal substrate 2 in the same shapes. An area in the crystal substrate 2 between the main electrodes 13, 13 constitutes a vibrating area $1a$ of the main oscillator unit 11, and an area between the auxiliary electrodes 23, 23 constitutes a vibration area $1b$ of the auxiliary oscillator unit 21.

The main oscillator unit 11 in this example is structured to use thickness shear vibration among vibration modes occurring in the crystal substrate 2, and use a fundamental wave among vibration waves thereof to generate oscillation. Because the charge of the fundamental wave becomes large in a center portion in a Z-axis direction of the crystal substrate 2, the main electrode 13 is formed in a rectangular shape in the center portion as illustrated in FIG. 2.

Figure 4:
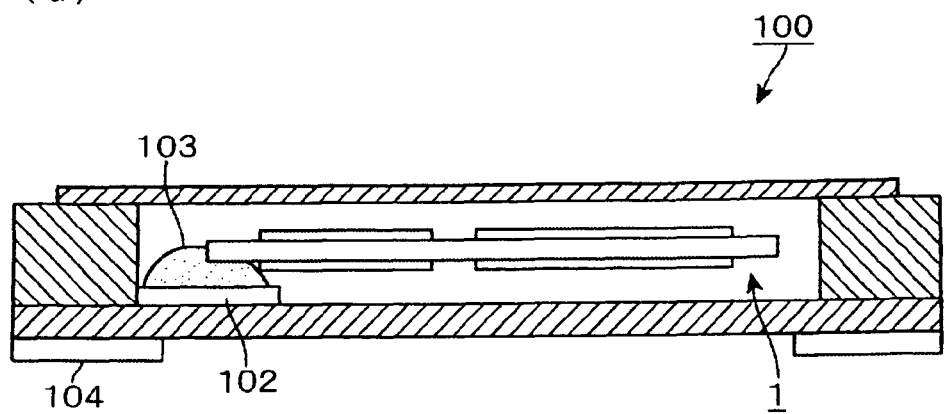
FIG. 4(a) and FIG. 4(b) are schematic views illustrating an overview of the crystal resonator accommodated in a package.
Figure 4:
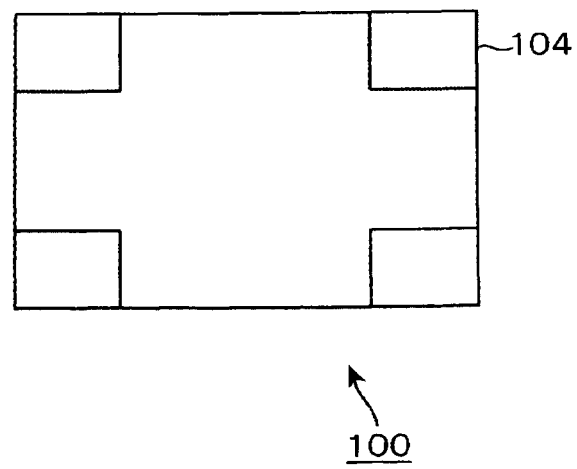

Numerals 4 in FIG. 2 denote lead-out electrodes routed in end portion areas of the crystal substrate 2 respectively from the electrodes 13, 23 on the upper face side and the lower face side, and these four lead-out electrodes 4 are routed through, although not illustrated, surface portions and side face portions of the crystal resonator 1 for example, and connected electrically in an end portion area on the lower face of this crystal resonator 1 to the above-described oscillator circuit 12 (22) by not-illustrated conducting paths routed through a package 100 via a conductive adhesive 103, as illustrated in FIG. 4(*a*). This crystal resonator 1 is fixed in a cantilever state by the conductive adhesive 103 in the package 100 which is sealed airtight. Numeral 102 in FIG. 4(*a*) denotes four internal electrodes formed in the package 100, and numeral 104 in FIG. 4(*b*) denotes external electrodes formed on the lower face of the package 100. These internal electrodes 102 and external electrodes 104 connect the respective lead-out electrodes 4 to the oscillator circuit 12 (22). Incidentally, in FIG. 3, illustrations of these lead-out electrodes 4 are omitted. Further, in FIG. 2, the electrodes 13, 23, 4 are hatched. Each axis in FIG. 2 and FIG. 3 shows a crystal axis direction of the crystal substrate 2.

Figure 5:
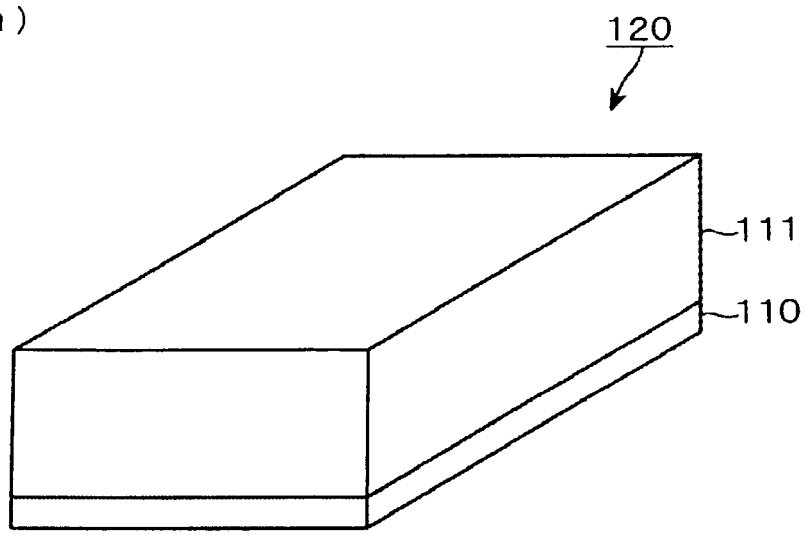
FIG. 5(a) and FIG. 5(b) are perspective views illustrating a schematic appearance of the TCXO.
Figure 5:
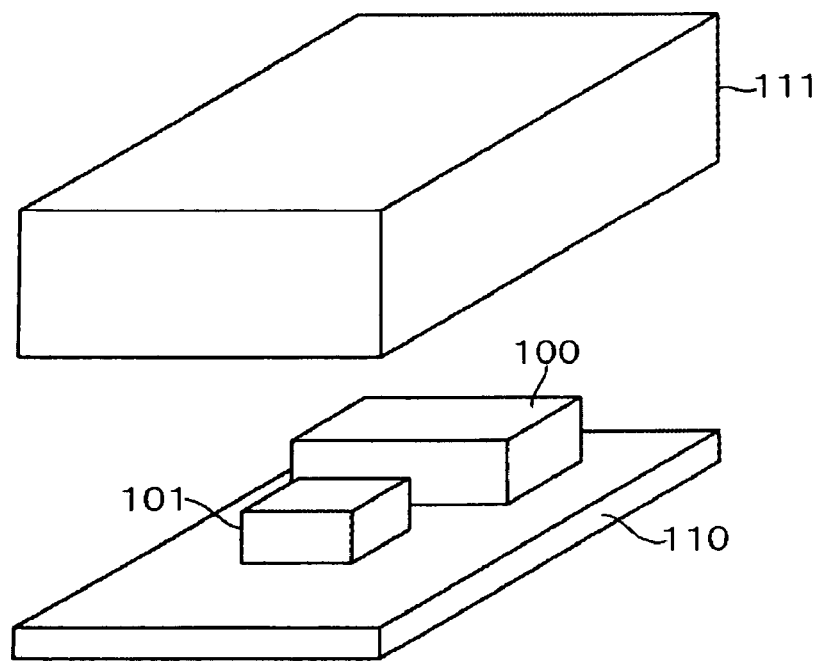

The above-described package 100 is, as illustrated in FIG. 5(*a*) and FIG. 5(*b*), disposed on a substrate 110 together with an oscillation control unit 101 accommodating the main oscillator circuit 12, the auxiliary oscillator circuit 22, and the control voltage supply unit 31 to constitute the crystal oscillator (TCXO) 120. In addition, numeral 111 in FIG. 5(*a*) and FIG. 5(*b*) denotes a cover member provided to cover the oscillation control unit 101 and the package 100 on the substrate 110 from an upper side in an airtight manner, and FIG. 5(*b*) illustrates a state that this cover member 111 is removed.

The already described control voltage supply unit 31 is connected to a front stage side (input side) of the main oscillator unit 11, and this control voltage supply unit 31 is structured to apply the control voltage $V_c$ to the main oscillator unit 11 via a varicap diode 14, which is a variable capacitance element. This control voltage supply unit 31 is structured to generate the control voltage $V_c$ by subtracting, as shown in equation (2), the temperature compensation voltage $\Delta V$ from a reference voltage $V_0$ of the main oscillator unit 11 (it can also be said as addition depending on the sign of $\Delta V$).

$$V_c = V_0 - \Delta V \quad (2)$$

This reference voltage $V_0$ is a control voltage when the set frequency $f_0$ is outputted from the main oscillator unit 11 at a reference temperature $T_0$, for example 29° C. Further, the temperature compensation voltage $\Delta V$ is represented as follows. Specifically, due to that the control voltage V and an oscillation frequency f are in a proportional relation, $\Delta V$ is represented as following equation (3), and equation (4) holds true. Thus, $\Delta V$ is represented as equation (5). Here, symbol T denotes a temperature, $\Delta f = f - f_0$ detected by a temperature detecting unit (temperature sensor) 32.

$$\Delta V = V_0 (\Delta f / f_0) \quad (3)$$

$$\Delta f / f_0 = \alpha_1 (T - T_0)^3 + \beta_1 (T - T_0) + \gamma_1 \quad (4)$$

$$\Delta V = V_0 \{ \alpha_1 (T - T_0)^3 + \beta_1 (T - T_0) + \gamma_1 \} \quad (5)$$

Symbols $\alpha_1$, $\beta_1$, and $\gamma_1$ denote constants inherent to this main oscillator unit 11, and can be obtained by providing the main oscillator unit 11 (TCXO) in a thermostatic oven in advance for example, inputting the reference voltage $V_0$ for example, measuring the frequency f while varying the temperature T in the thermostatic oven, and solving a simultaneous equation which can be obtained by substituting the temperature T and the measurement result in the above-described equation (4).

The auxiliary oscillator unit 21 shares the crystal resonator 1 used for the main oscillator unit 11, and includes the auxiliary oscillator circuit 22 connected to the auxiliary electrodes 23 on the crystal resonator 1. Numeral 5 denotes an input end, and a control voltage $V_{10}$ is applied via this input end 5 to the auxiliary vibration area 1*b* which is an area between the auxiliary electrodes 23, 23 via the varicap diode 24, which is a variable capacitance element. The auxiliary oscillator circuit 22 is structured to use thickness shear vibration among vibration modes generated in the crystal resonator 1, so as to oscillate at an overtone, for example a third overtone as a vibration wave. In the third overtone, the peak of a charge is located in each of three-section areas when the crystal substrate 2 is divided into three areas in the Z axis direction of this crystal substrate 2. Accordingly, among these three areas, to suppress the influence of the fundamental wave, the auxiliary electrodes 23, 23 are formed on both end sides to avoid the central area as much as possible. That is, the auxiliary electrodes 23, 23 are disposed to extend in the X axis direction in parallel to each other on the both end sides in the Z axis direction of the crystal substrate 2, and end portions on the side opposite to the main electrodes 13 are connected to each other.

The already described control voltage supply unit 31 is connected to a rear stage side of the auxiliary oscillator unit 21. The control voltage supply unit 31 includes a frequency detecting unit 33 constituted of a frequency counter for measuring the frequency f from a frequency signal inputted from the auxiliary oscillator unit 21, and so on for example, a temperature estimating unit 34 estimating the temperature T based on the frequency f measured in the frequency detecting unit 33, a compensation voltage calculating unit 35 for calculating the already described compensation voltage $\Delta V$ based on the temperature T estimated in the temperature estimating unit 34, and an adding unit 36 for outputting to the main oscillator unit 11 the control voltage $V_c$ obtained by subtracting the compensation voltage $\Delta V$ calculated in the compensation voltage calculating unit 35 from the reference voltage $V_0$. Here, the calculation in the adding unit 36 is decided to be either $(V_0 - \Delta V)$ or $(V_0 + \Delta V)$ depending on either the sign of the compensation voltage $\Delta V$ is decided to be positive or negative. In this embodiment, since the $\Delta V$ obtained by the previous equation (5) is handled as the compensation voltage, this calculation is expressed as $(V_0 - \Delta V)$. In short, there may be performed a calculation to compensate $V_0$ with $\Delta V$ by the amount of variation of the frequency f from the set frequency $f_0$ according to the frequency-temperature characteristics.

In the temperature estimating unit 34, the frequency-temperature characteristics (cubic function in this example) of the auxiliary oscillator unit 21 are stored, and the temperature T of the crystal resonator 1 is obtained based on this temperature characteristic and the oscillation frequency f of the auxiliary oscillator unit 21 ($f_0$ and $T_0$ are set in advance). The compensation voltage calculating unit 35 also includes, for example, a cubic function generator which is the temperature characteristic of the main oscillator unit 11, and the compensation voltage $\Delta V$ is obtained with the already described equation (5) and the temperature T.

Figure 6:
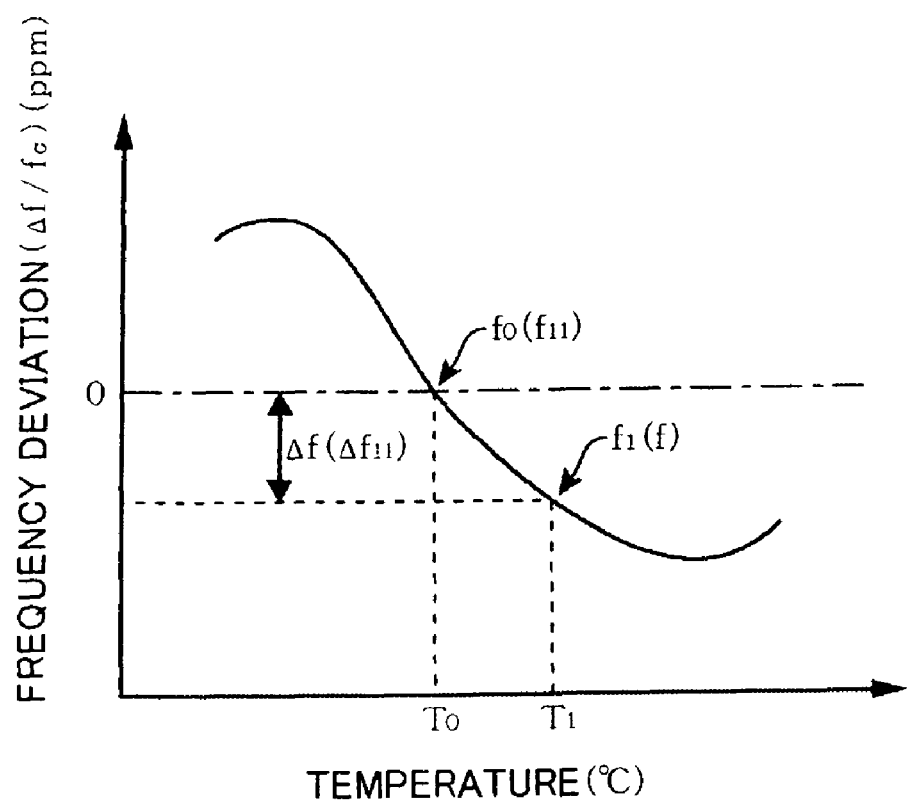
FIG. 6 is a characteristic graph illustrating an example of frequency-temperature characteristics in the TCXO.

Next, operations of the above-described embodiment will be described. The voltage $V_c$ obtained by subtracting the temperature compensation voltage $\Delta V$, which will be described later, from the reference voltage $V_0$ with which the set frequency $f_0$ is outputted at the reference temperature $T_0$ in the main oscillator unit 11, for example 29° C., is supplied to the main oscillator circuit 12 via the varicap diode 14. Thus, the main oscillator circuit 12 oscillates at the frequency f of the fundamental wave of the thickness shear vibration in the main vibration area 1*a*. At this time, assuming that the crystal resonator 1 is at the temperature $T_1$ ($T_1 > T_0$) for example and the control voltage V is the reference voltage $V_0$, the frequency f of oscillation in the main oscillator unit 11 attempts to shift to the frequency $f_1$ corresponding to the temperature $T_1$ along a cubic curve, which is a temperature characteristic curve, from the set frequency $f_0$ corresponding to the reference temperature $T_0$, as illustrated in FIG. 6. However, the control voltage $V_c$ supplied to the main oscillator unit 11 as described above is a value obtained by compensating the reference voltage $V_0$ with the temperature compensation voltage ΔV, and thus the set frequency $f_o$ is outputted from the output end 6. Such a temperature compensation voltage ΔV is calculated in the control voltage supply unit 31 as described below.

Figure 7:
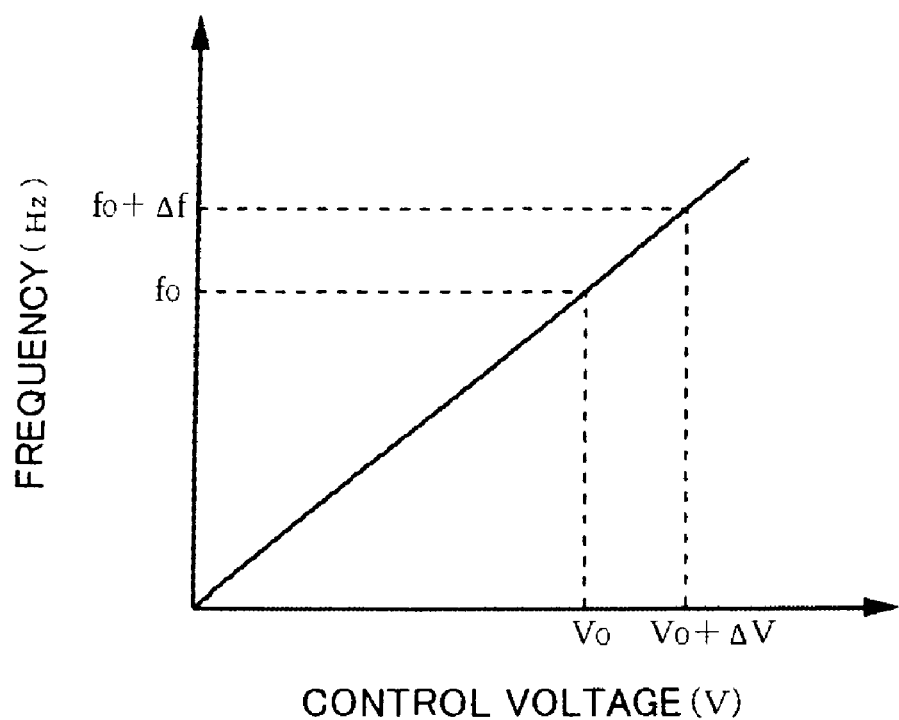
FIG. 7 is a characteristic graph illustrating a frequency/voltage characteristic in the TCXO.

As already described, the oscillation frequency f in the main oscillator unit 11 is proportional to the control voltage V as illustrated in FIG. 7. Accordingly, to compensate the Δf, which is a difference between the frequency $f_1$ and the set frequency $f_0$, in the control voltage supply unit 31, the control voltage V is controlled to increase by the compensation voltage ΔV corresponding to Δf. The compensation voltage Δf is obtained by substituting the temperature $T_1$ with the temperature T in the above-described equation (5). The temperature $T_1$ is conventionally detected outside the already described package 100 using a thermistor for example, but in this embodiment, it is calculated based on the oscillation frequency f of the auxiliary oscillator unit 21 as described below. Specifically, by inputting the control voltage $V_{10}$ to the input end 5, the auxiliary oscillator circuit 22 oscillates at the frequency f of the third harmonic of the thickness shear vibration in the auxiliary vibration area 1*b*. The frequency detecting unit 33 detects this oscillation frequency f, and the temperature estimating unit 34 estimates the temperature T using equation (6).

$$f = f_{10}\{1 + \alpha_2(T - T_{10})^3 + \beta_2(T - T_{10}) + \gamma_2\} \quad (6)$$

Symbol $T_{10}$ denotes a reference temperature, for example 29° C., and symbol $f_{10}$ denotes a frequency obtained when the reference voltage $V_{10}$ is supplied as a control voltage to the auxiliary oscillator circuit 22. Constants $\alpha_2$, $\beta_2$, and $\gamma_2$ are obtained by varying the temperature T using the thermostatic oven in advance, and measuring the frequency f each time. These constants are different for various values of the control voltage V, and so the control voltage V inputted to the input end 5 is the same as the voltage when these constants are obtained, for example $V_{10}$. Thus, in this embodiment, the auxiliary oscillator unit 21 sharing the crystal substrate 2 of the crystal resonator 1 of the main oscillator unit 11 is used as the temperature detecting unit 32. The compensation voltage calculating unit 35 calculates the compensation voltage ΔV based on the thus obtained temperature $T_1$ and the already described equation (5). Accordingly, the oscillation frequency f of the main oscillator unit 11 attempts to increase by Δf, and this cancels out the operation of the oscillation frequency f to decrease by Δf due to being the temperature $T_1$. So, the frequency f outputted from the output end 6 is maintained at the set frequency $f_0$.

Here, the fundamental wave and the third overtone will be described with respect to the frequency-temperature characteristics of the oscillation frequency f. Comparing the both, the third overtone is larger than the fundamental wave in the amount of change in the cubic function. When the cubic function of the fundamental wave is subtracted from the cubic function of the third overtone, that is, when the difference of Δf/f at each temperature is obtained, this is expressed as FIG. 8.

Figure 9:
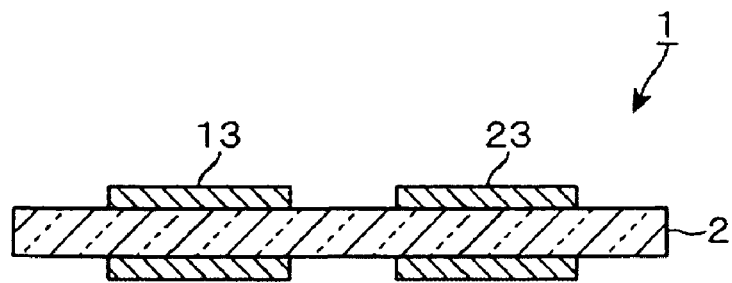
FIG. 9(a) to FIG. 9(c) are side cross-sectional views illustrating another example of the crystal resonator in the TCXO.
Figure 9:
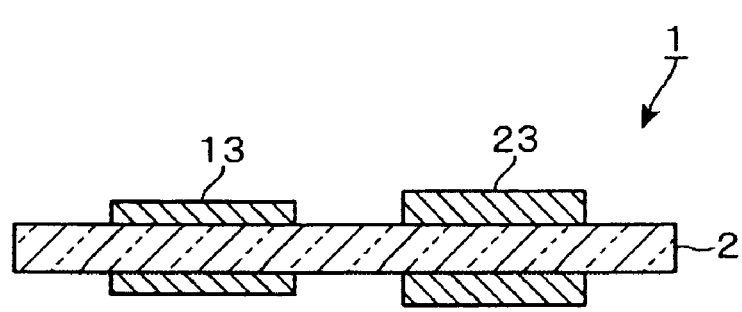
Figure 9:
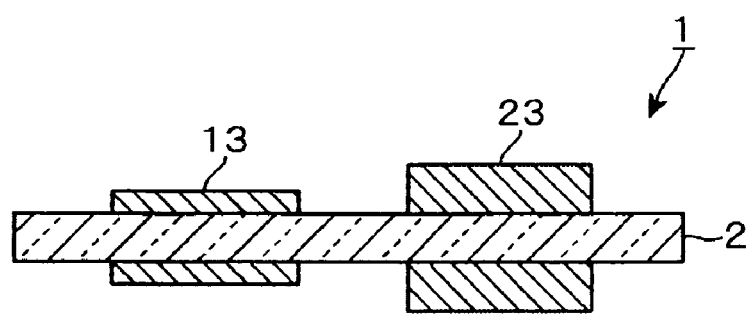
Figure 10:
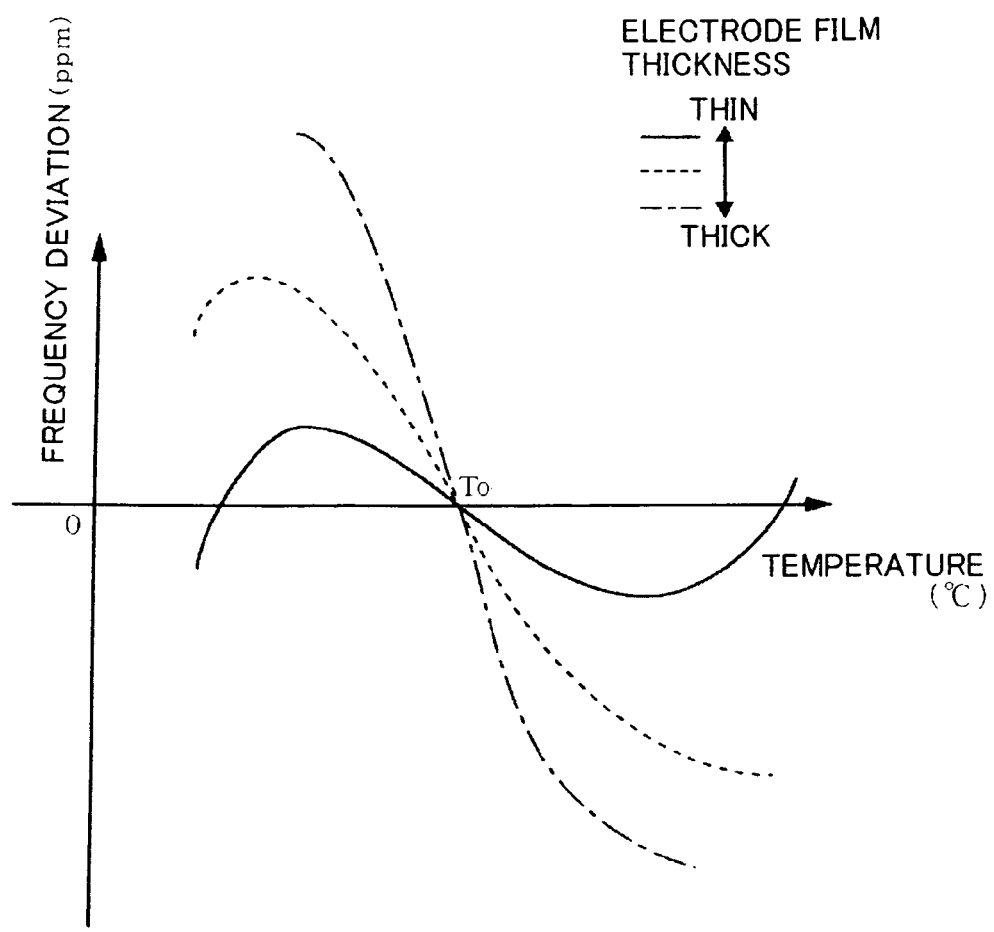
FIG. 10 is a characteristic graph illustrating an example of the frequency-temperature characteristics.

It is known that, in the fundamental wave, the larger the mass of the electrodes 13, the more the frequency-temperature characteristics rotate clockwise and the larger the amount of change of the frequency f accompanying the temperature change becomes. In this respect, the present inventor has further obtained the following findings by experiment. Specifically, when the mass of the electrodes 23 is likewise increased for the third overtone similarly as illustrated in FIG. 9(*a*) to FIG. 9(*c*), the cubic function which is the frequency-temperature characteristics rotate clockwise as illustrated schematically in FIG. 10. However, for the third overtone, the degree of the clockwise rotation with respect to the amount of mass increase of the electrodes 23 is larger than in the fundamental wave.

Figure 11:
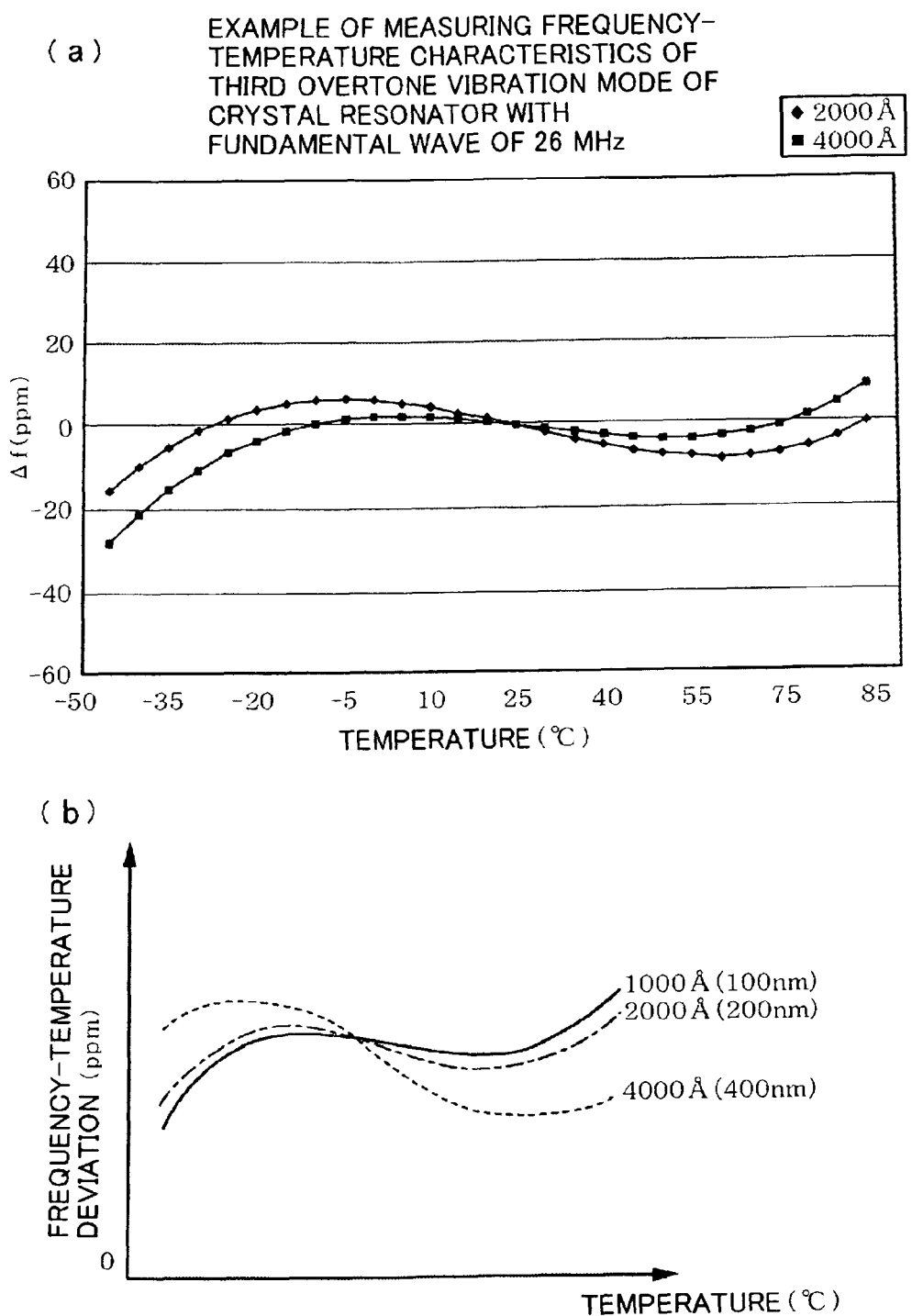
FIG. 11(a) and FIG. 11(b) are characteristic graphs illustrating frequency-temperature characteristics obtained in the present invention.

That is, in the vibration mode of third overtone when the crystal resonator 1 with a fundamental wave of 26 MHz is used, with respect to the frequency-temperature characteristics obtained when the film thickness of the electrodes 23 is 1000 Å (100 nm), the characteristic rotates clockwise as illustrated in FIG. 11(*a*) when the film thickness of the electrodes 23 is 2000 Å (200 nm). A schematic summary of these frequency-temperature characteristics is illustrated in FIG. 11(*b*).

Thus, using the oscillation of the third overtone rather than the fundamental wave for temperature detection yields high temperature detectivity. So, in this embodiment, it is preferred that the mass of the auxiliary electrodes 23 be larger than the mass of the main electrodes 13. Examples of techniques to make the mass of the electrodes 23 larger include increasing at least one of the thickness and the area of the electrodes 23, and selecting the material for the electrodes 23. With the fundamental wave, also the amount of change in the frequency f with respect to the temperature T is smaller than that in the overtone, and thus using this fundamental wave in the main oscillator unit 11 suppresses errors small in the frequency f (set frequency $f_0$) to be outputted even when the temperature T changes. Accordingly, a TCXO with a small frequency change (which is stable) can be obtained.

According to the above-described embodiment, since the auxiliary oscillator unit 21 which shares the crystal substrate 2 with the main oscillator unit 11 is used as the temperature detecting unit 32 detecting the temperature T for obtaining the compensation voltage ΔV in the TCXO, the temperature T can be measured in an area (the auxiliary oscillator unit 21) quite close to the main oscillator unit 11 which oscillates with the set frequency $f_0$ to the outside. Accordingly, errors in measurement of the temperature T can be suppressed quite small. Thus, a TCXO which excels in frequency stability and has small electronic noise can be obtained, compared to the conventional TCXO for example in which a temperature detecting unit such as a thermistor is provided separately from the crystal resonator 1 and adjacent to the package 100 accommodating the crystal resonator 1. Further, in the crystal resonator 1, since the auxiliary electrodes 23 connected to the auxiliary oscillator circuit 22 are disposed separately from the main electrodes 13 connected to the main oscillator circuit 12, no filter is required and thus the TCXO can be formed with a simple circuit, compared to the conventional MCXO (Microcomputer Compensated Xtal Oscillator). Moreover, since the auxiliary oscillator circuit 22 for obtaining the temperature T uses the overtone, the sensitivity (change in the frequency f) with respect to a change of the temperature T improves more than by using the fundamental wave as already described, and hence a TCXO with a highly stable frequency characteristic can be obtained.

Figure 12:
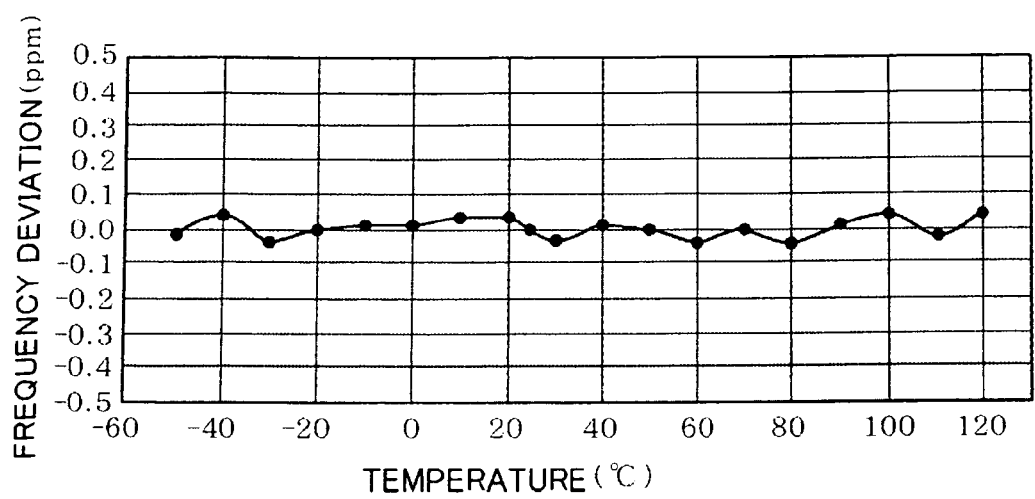
FIG. 12 is a characteristic graph illustrating a temperature/frequency characteristic obtained in the TCXO.

A curve of an actually obtained frequency deviation $\Delta f/f_0$ in such a TCXO is illustrated in FIG. 12, from which it was found that an excellent frequency deviation $\Delta f/f_0$ of approximately ±0.01 ppm is obtained from −50° C. to 120° C., which is wider than the temperature range (−200° C. to 75° C.) which is compensated to approximately ±0.2 ppm in the conventional TCXO.

Next, modification examples of the above-described first embodiment will be enumerated.

Figure 13:
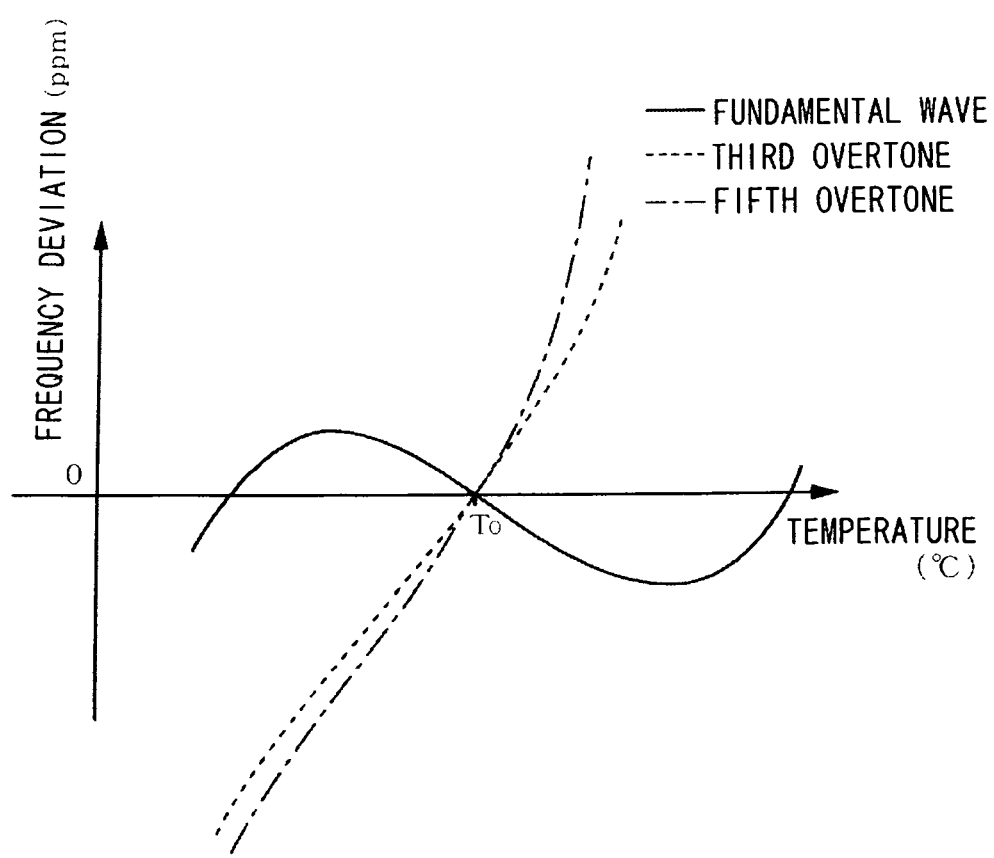
FIG. 13 is a characteristic graph schematically illustrating characteristics obtained in the fundamental wave and the overtone of the TCXO.

In the first embodiment, the third overtone is used as the vibration wave in the auxiliary oscillator unit 21. However, a fifth overtone, or a seventh or higher overtone may be used. Specifically, as illustrated in FIG. 13, the fifth overtone is larger than the third overtone in the amount of variation in frequency deviation with respect to temperature changes in the frequency-temperature characteristics, that is, it is a state that the cubic curve as the frequency-temperature characteristics rotated clockwise. Further, the seventh or higher overtone is larger than the fifth overtone in the amount of variation. Thus, the temperature T can be detected with much higher sensitivity by using a high-order overtone. When an overtone is used in this manner, it is preferred that the auxiliary electrodes 23 be disposed at a position on the crystal substrate 2 where a charge in this overtone becomes large.

Figure 14:
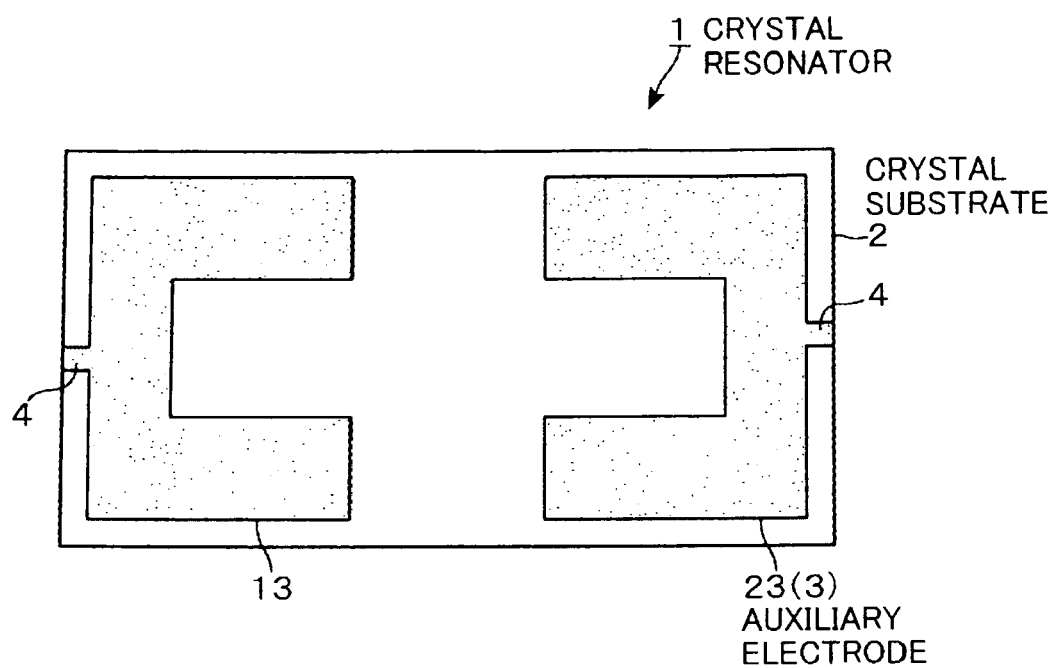
FIG. 14 is a plan view illustrating another example of the crystal resonator.

The vibration wave used in the main oscillator unit 11 is not limited to the fundamental wave, and an overtone, for example the third overtone may be used. In this case, the respective electrodes 13, 23 in the crystal substrate 2 are disposed in a layout illustrated in FIG. 14. The main electrode 13 has the same shape as the already described auxiliary electrodes 23, and is disposed so that an opening portion of this main electrode 13 opposes an opening portion of the auxiliary electrode 23 for example. Further, in the main oscillator unit 11, a fifth overtone or a seventh or higher overtone may be used.

Furthermore, an overtone may be used in the main oscillator unit 11, and a fundamental wave may be used in the auxiliary oscillator unit 21. Also in this case, effects similar to those in the above-described example can be obtained since the temperature T is measured in the auxiliary oscillator unit 21 which shares the crystal substrate 2 with the main oscillator unit 11. In this case, the respective electrodes 13, 23 are disposed in the form that the respective electrodes 13, 23 in FIG. 2 are replaced with each other.

In addition, the fundamental wave may be used as a vibration wave in both of the main oscillator unit 11 and the auxiliary electrodes 23. However, in the temperature characteristic of the oscillator unit using an overtone as already described, the degree of a clockwise rotation when the mass of the electrodes is made large is larger than that when the fundamental wave is used. Thus, it is preferred that the overtone be used in the auxiliary oscillator unit 21 for detecting temperatures.

Second Embodiment

Next, a second embodiment of the present invention will be described. In this second embodiment, plural groups of auxiliary electrodes 23 for taking out vibration waves different from each other are provided to obtain a sum or a difference between frequencies f taken out by the respective groups of the auxiliary electrodes 23, and a frequency f calculated in this manner is used as a temperature detection signal. One example of this embodiment is such that two groups of auxiliary electrodes 23 are provided, and a difference between the frequency $f_{11}$ oscillated by one auxiliary electrodes 23 (first auxiliary electrodes 23a) and the frequency $f_{12}$ oscillated by the other auxiliary electrodes 23 (second auxiliary electrodes 23b) is used as a temperature detection signal. FIG. 15(a) to FIG. 15(c) illustrate examples of layouts of the electrodes 13, 23 of the crystal resonator 1 used in such an example.

FIG. 15(a) illustrates an example in which one auxiliary electrode 23a adjacent to the main electrode 13 out of the two auxiliary electrodes 23a, 23b is disposed in a middle portion in the Z axis direction on the crystal substrate 2 similarly to the main electrode 13, so as to use the fundamental wave, and the other auxiliary electrode 23b is disposed similarly to the auxiliary electrodes 23 in already described FIG. 2, so as to use the third overtone. In this case, an area between the auxiliary electrodes 23a, 23a formed on an upper face and a lower face of the crystal substrate 2 forms a first auxiliary vibration area, and an area between the auxiliary electrodes 23b, 23b formed on the upper face and the lower face of the crystal substrate 2 forms a second auxiliary vibration area.

FIG. 15(b) illustrates an example in which both the two auxiliary electrodes 23a, 23b are disposed in the layout illustrated in already described FIG. 2, and opening portions of these auxiliary electrodes 23a, 23b are disposed to be directed to the main electrode 13 side. FIG. 15(c) illustrates an example in which also the main electrode 13 is disposed in the same shape as the auxiliary electrodes 23 in this example, so as to use the third overtone for example. Also in this second embodiment, similarly to the first embodiment, a vibration wave of any one of the fundamental wave and the third, fifth, seventh and higher overtones may be used for each of the main electrode 13 and the auxiliary electrodes 23a, 23b. When one of them is used, it is preferred that the electrodes 13, 23a, 23b be shaped and/or disposed suitably for this vibration wave.

Figure 8:
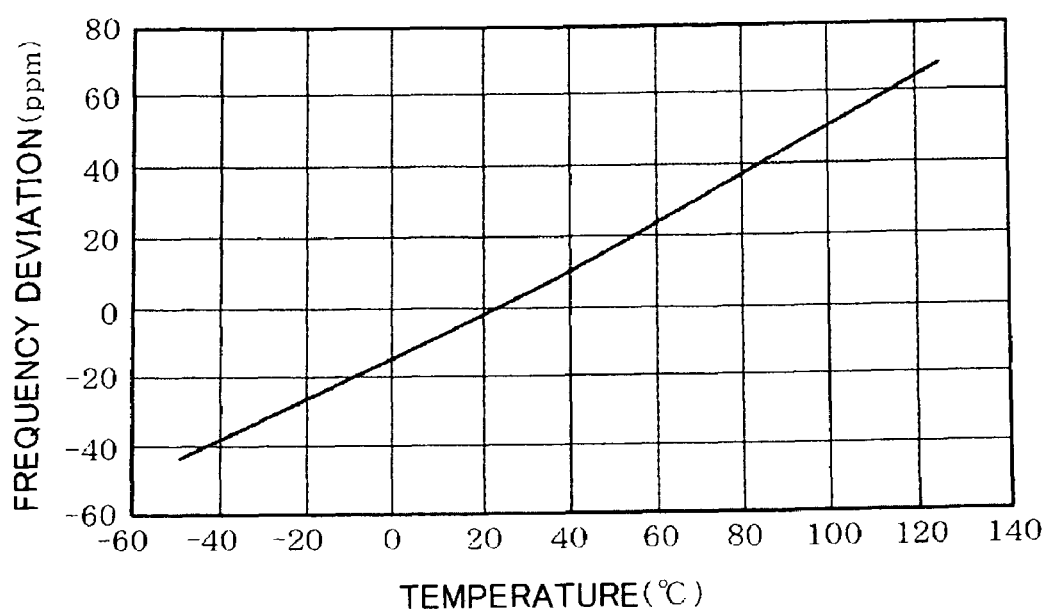
FIG. 8 is a characteristic graph illustrating a difference between a fundamental wave and a third overtone in the TCXO.
Figure 16:
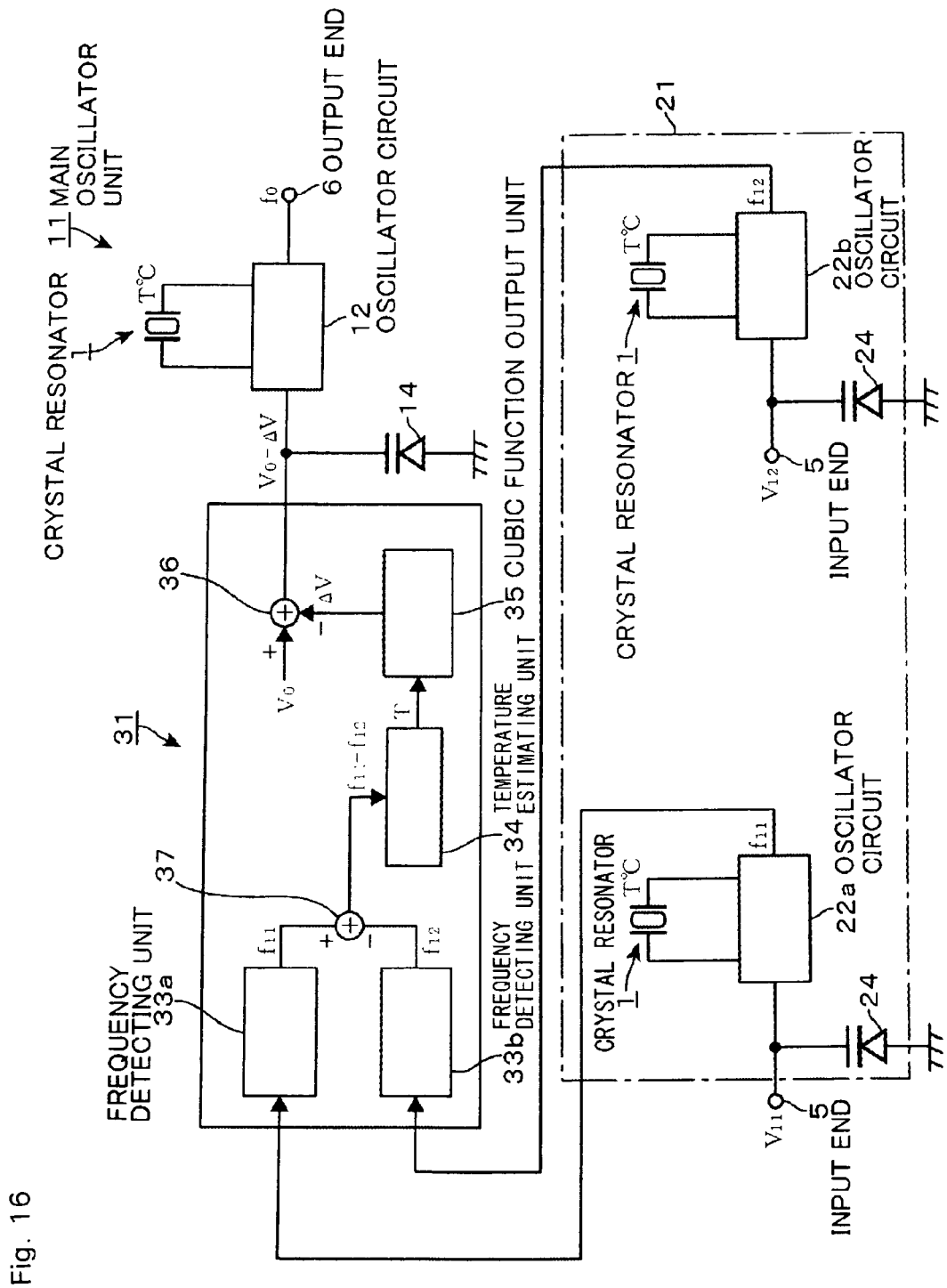
FIG. 16 is a circuit diagram illustrating another example of the TCXO.

Next, an example of a circuit in this second embodiment is illustrated in FIG. 16. The TCXO of this second embodiment includes a first auxiliary oscillator circuit 22a and a second auxiliary oscillator circuit 22b, which are connected respectively to the auxiliary electrodes 23a, 23b. Frequencies $f_{11}$, $f_{12}$ of frequency signals outputted from these auxiliary oscillator circuits 22a, 22b are detected by a first frequency detecting unit 33a and a second frequency detecting unit 33b, respectively, provided in a control voltage supply unit 31, and a difference therebetween is calculated in an adding unit 37. A temperature estimating unit 34 is configured to estimate the temperature T based on relation data of the difference ($f_{11} - f_{12}$) in the frequencies f and temperatures T and the difference in the detected frequencies f. Already described FIG. 8 represents relation data of difference frequencies between the fundamental wave and the third overtone and temperatures, in which a cubic curve which is frequency-temperature characteristics in the fundamental wave is subtracted from a cubic curve which is frequency-temperature characteristics in the third overtone. As can be seen from this graph, a calculated frequency deviation is in a substantially proportional relation with the temperature T. When the cubic function is used, the frequency deviation becomes large as the temperature T departs from the reference temperature $T_0$, and becomes small after the temperature T passes the crest (peak) portion. In this respect, when the difference is obtained as described above, the frequency deviation becomes large in a substantially linear relation as the temperature T departs from the reference temperature $T_0$. Thus, it can be said that such an embodiment is advantageous when temperature compensation is performed at the temperature T in a wide range, that is, in an actual product.

The temperature estimating unit 34 may be structured to include, for example, a memory for storing relation data of the difference ($f_{11}-f_{12}$) in the frequencies and the temperature T, and a unit for reading the temperature T corresponding to the difference ($f_{11}-f_{12}$) in the frequencies obtained in the adding unit 37 from the relation data in the memory.

The advantage in obtaining the difference in the frequencies f in this manner can be obtained not only between the fundamental wave and the overtone, but also when overtones with numbers of order different from each other are used. In addition, a technique for obtaining a frequency difference in respective frequency signals of the two auxiliary oscillator circuits 22a, 22b may be such that when the respective frequencies f are sinusoidal waves, both the frequency signals are mixed in a mixer constituted of an analog circuit to obtain a frequency signal having the frequency f of a difference in the signals, and the frequency f of this frequency signal is detected by the frequency detecting unit 33.

Further, instead of obtaining the frequency difference in the respective frequency signals of the auxiliary oscillator circuits 22a, 22b, the sum of the frequencies f may be obtained, and the temperature T may be obtained with reference to, for example, the relation data in the memory based on the obtained frequency f. Additionally, three or more groups of the auxiliary electrodes 23 may be provided, and frequency signals obtained in the groups may be added or subtracted to obtain the temperature T based on a calculated value. Moreover, regarding the main electrode 13, plural groups, for example three groups of main electrodes 13 for taking out vibration waves different from each other may be provided. In addition, in the circuit of FIG. 16, the same components as those in already described FIG. 1 are given the same numerals.

In the above-described embodiments, the AT-cut substrate is used as the crystal substrate 2. However, the direction of cutting the crystal substrate 2 may be SC cut, FC cut, IT cut, or the like for example, or may be BT cut when the thickness shear vibration is used. Instead of the crystal substrate 2, for example, SC cut, FC cut, IF cut, or the like may be used.

[Example with the Auxiliary Oscillator Unit in a Contour Shear Mode]

Figure 17:
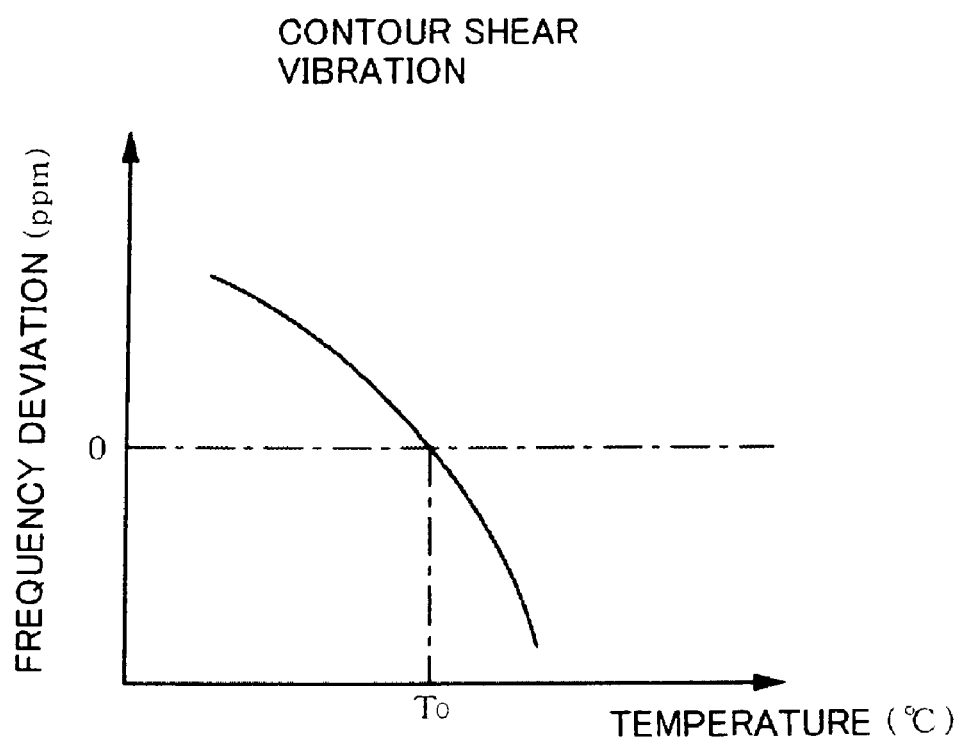
FIG. 17 is a schematic graph illustrating a characteristic regarding thickness shear vibration and contour shear vibration.

In the above-described embodiments, the thickness shear vibration is used in both the main oscillator unit 11 and the auxiliary oscillator unit 21. However, a contour shear vibration mode (surface shear vibration mode) may be used in the auxiliary oscillator unit 21. In the contour shear vibration, the frequency-temperature characteristics are approximated as a negative quadratic function as illustrated in FIG. 17. An area slanting to the right in a quadratic function illustrated in FIG. 17 is a portion between −40° C. to +100° C. as a temperature range for example, and covers a temperature range of using which is required in specifications of the oscillator. Accordingly, in the contour shear vibration, in the temperature range of using the TCXO, a large amount of variation in the frequency f with respect to the temperature T can be taken compared to the thickness shear vibration, and thus use of the contour shear vibration as the vibration mode of the auxiliary oscillator unit 21 allows to detect the temperature T with high sensitivity.

Third Embodiment

Figure 18:
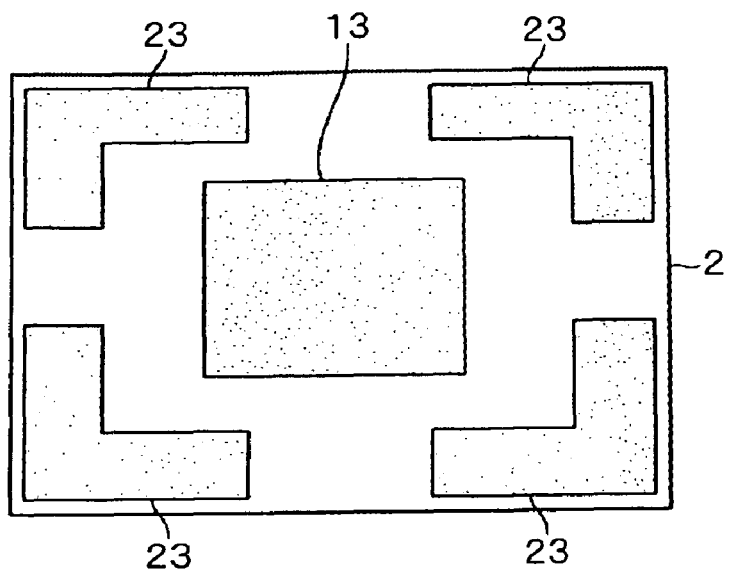
FIG. 18 is a plan view illustrating another example of the TCXO.

An example of this embodiment is such that the vibration mode of the main oscillator unit 11 is the thickness shear vibration and the vibration mode of the auxiliary oscillator unit 21 is the contour shear vibration. The main electrode 13 in this case is formed in a rectangular shape in a center portion of the crystal substrate 2, and the layout of the auxiliary electrodes 23 is such that, as illustrated in FIG. 18 for example, they are disposed at four corner portions of the crystal substrate 2 in a substantially L shape along the corner portions. Although FIG. 18 illustrates the layout of the main electrode 13 and the auxiliary electrodes 23 on a front face side of the crystal substrate 2, the main electrode 13 and the auxiliary electrodes 23 are disposed on a rear face side of the crystal substrate 2 in the same layout as the front face side. A common auxiliary oscillator circuit 22 is connected to each of the four auxiliary electrodes 23, for example.

In the oscillator having such a structure, similarly to the above embodiments using the thickness shear vibration as the vibration mode of the main oscillator unit 11 and the auxiliary oscillator unit 21, various combinations may be used for combinations of the vibration wave used in the main oscillator unit 11 and the vibration wave used in the auxiliary oscillator unit 21. That is, any one of the fundamental wave and overtones (third, fifth, seventh, and so on) may be used in the main oscillator unit 11 and the auxiliary oscillator unit 21. In these units, the same vibration waves may be used, or vibration waves different from each other may be used (for example, the fundamental wave is used in the main oscillator unit 11, and the third overtone is used in the auxiliary oscillator unit 21).

Figure 15:
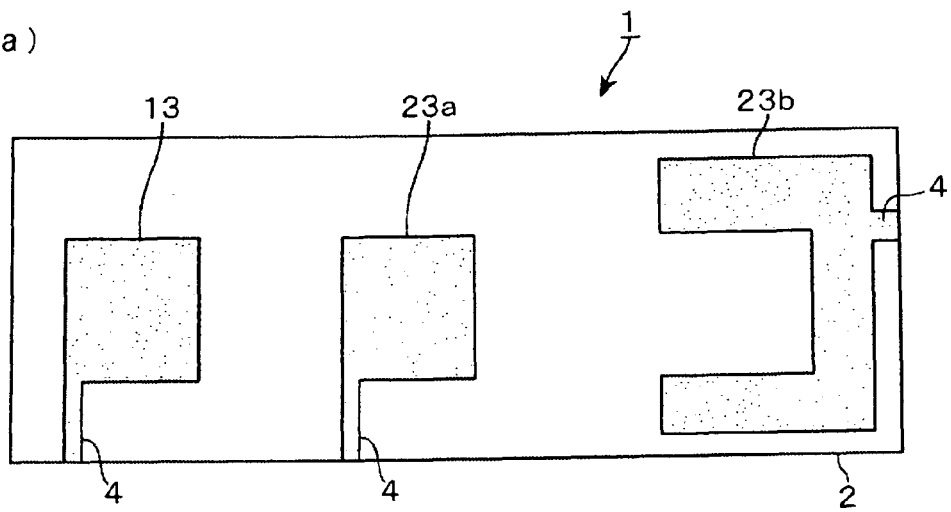
FIG. 15(a) to FIG. 15(c) are plan views illustrating other examples of the crystal resonator.
Figure 15:
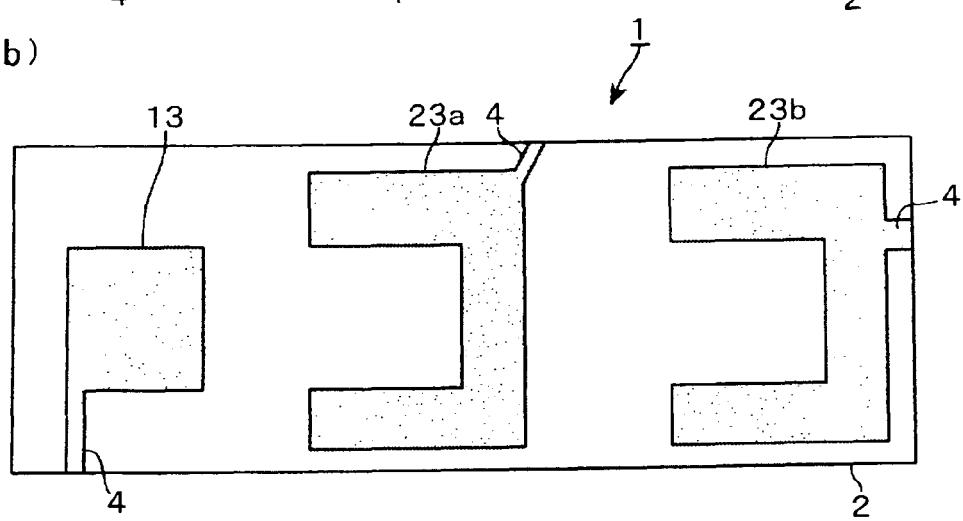
Figure 15:
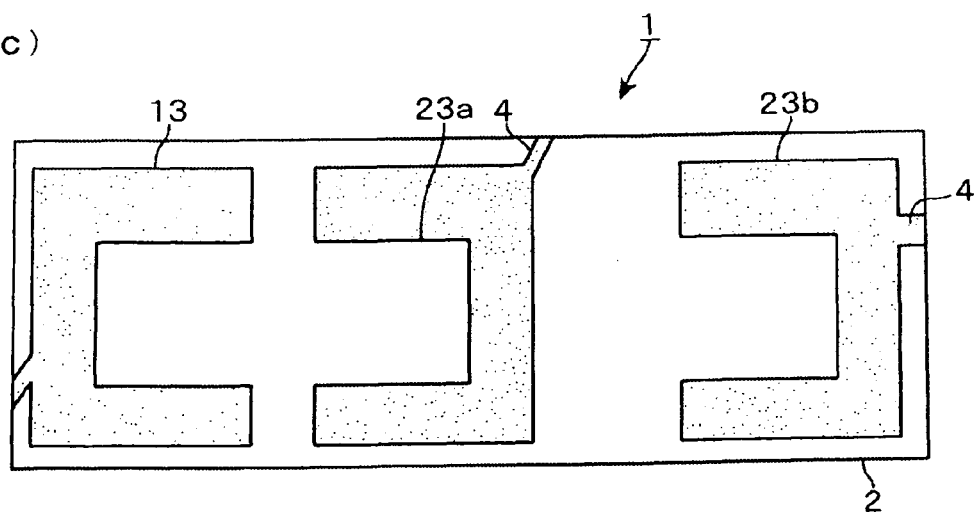

Moreover, as illustrated in already described FIG. 15, this embodiment may be an example in which plural groups of auxiliary electrodes 23 are used, or an example in which plural groups of main electrodes 13 are used. In this case, for example, a difference or an added value of frequencies obtained from the two auxiliary electrodes 23 may be obtained, so as to obtain the temperature based on the difference or the added value. In an example using two groups of auxiliary electrodes 23, the auxiliary oscillator circuits 22a, 22b are connected to each of two groups opposing each other in a diagonal direction of the crystal substrate 2 among the four auxiliary electrodes 23 illustrated in FIG. 18, and a difference or an added value of the frequencies $f_{11}$, $f_{12}$ outputted from these groups is used as a temperature detection signal.

Thus, the third embodiment is an example using the contour shear vibration instead of the thickness shear vibration as the vibration mode of the auxiliary oscillator unit 21 in the first embodiment and the second embodiment. In addition, the vibration mode of the main oscillator unit 11 may be the contour shear vibration, and the vibration mode of the auxiliary oscillator unit 21 may be the thickness shear vibration.

When the contour shear vibration is used, the rectangular thickness shear vibration piece constituted of a rotated Y plate of a crystal system 32 in which the Z' axis and the X axis form one side and another side respectively, and the Y' axis is the thickness direction, for example the AT-cut crystal is used as the crystal substrate 2. However, instead of the crystal substrate 2, it may be a rotated Y plate of a material belonging to the crystalline system 32 (belonging to the point group 32) among piezoelectric resonator pieces, for example GaPO$_4$ (gallium phosphate), langasites (LGS, LGN, LGT), or the like.

Fourth Embodiment

Figure 19:
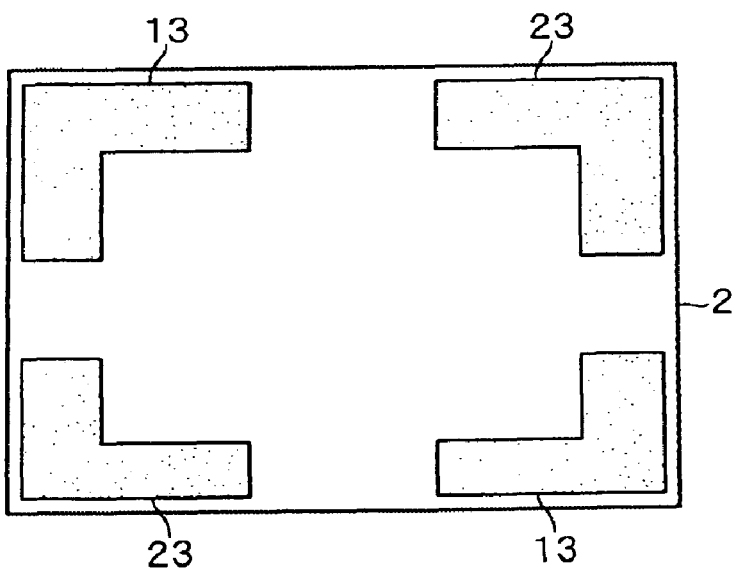
FIG. 19 is a plan view illustrating another example of the TCXO.
Figure 20:
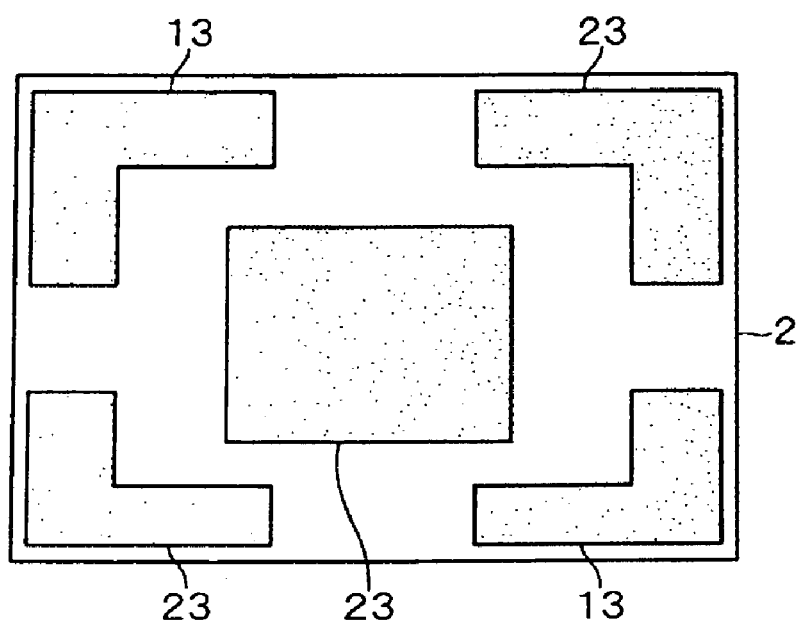
FIG. 20 is a plan view illustrating another example of the TCXO.

This embodiment is an example using the contour shear vibration as the vibration mode of the main oscillator unit 11 in the third embodiment, that is, an example using the contour shear vibration in both the main oscillator unit 11 and the auxiliary oscillator unit 21. An example of such an embodiment is such that, as illustrated in FIG. 19, in four corner portions on the crystal substrate 2, main electrodes 13 and auxiliary electrodes 23 in a substantially L shape are disposed in respective pairs of corner portions opposing each other on diagonal directions on an upper face and a lower face, respectively, of the crystal substrate 2. In this case, when for example two groups of auxiliary oscillator circuits 22 are provided as illustrated in FIG. 20, the thickness shear vibration may be used together with the contour shear vibration.

In the above examples, the vibration modes of the main oscillator unit 11 and the auxiliary oscillator unit 21 are chosen from the thickness shear vibration and the contour shear vibration. However, these two vibration modes are not restrictive, and for example, a parallel field excitation mode may be used. Here, in this specification, terms are distinguished such that the fundamental wave and the overtones are vibration waves, and the thickness shear vibration and the contour shear vibration are vibration modes. When all the terms are handled as vibration modes, it is preferred that the vibration modes be chosen so that the frequency-temperature characteristics of the vibration mode used in the auxiliary oscillator unit 21 (including the case of obtaining a difference in frequencies or an added value of frequencies using the two auxiliary oscillator circuits 22a, 22b) are larger than the frequency-temperature characteristics of the vibration mode used in the main oscillator unit 11 in the amount of variation in the frequency difference with respect to temperature changes (for example, the fundamental wave of the thickness shear vibration is assigned to the main oscillator unit 11, and the overtone of the thickness shear vibration is assigned to the auxiliary oscillator unit 21).

Further, in the second, third and fourth embodiments, it is preferred that the auxiliary electrode 23 be larger in weight than the main electrode 13, similarly to the first embodiment.

Moreover, in the examples described above, although the electrodes 13, 23 are disposed in the same layouts (positions and sizes) on both the upper and lower faces of the crystal substrate 2, the electrodes may be disposed in layouts different from each other on the upper and lower faces, or one electrodes 13, 23 to be grounded out of the upper and lower electrodes 13, 23 may be common electrodes to be shared with the other electrodes 13, 23.

Furthermore, in the examples described above, when the control voltage $V_c$ to be inputted to the main oscillator unit 11 is calculated, the frequency-temperature characteristics (the constants in the equation (6)) when the reference voltage $V_0$ is inputted to the main oscillator unit 11 are obtained in advance, the compensation voltage $\Delta V$ is calculated based on this characteristic in the compensation voltage calculating unit 35, and the compensation voltage $\Delta V$ is subtracted from the reference voltage $V_0$ in the adding unit 36. However, for example, the constants in the cubic function may be obtained for a control voltage $V_a$ different from the reference voltage $V_0$, a compensation voltage $\Delta V_a$ may be calculated based on this characteristic, and the compensation voltage $\Delta V_a$ may be subtracted from the control voltage $V_a$ to obtain a control voltage $V_c$ with which the set frequency $f_0$ is outputted.

What is claimed is:

1. A piezoelectric oscillator, comprising:
   a main oscillator unit for outputting a set frequency signal, the main oscillator unit comprising a piezoelectric resonator formed by providing a main electrode for forming a main vibration area on a piezoelectric substrate, and a main oscillator circuit connected to the main electrode;
   an auxiliary oscillator unit used as a temperature sensor, the auxiliary oscillator unit comprising a piezoelectric resonator formed by providing an auxiliary electrode for forming an auxiliary vibration area on the piezoelectric substrate used for the main oscillator unit separately from the main electrode, the piezoelectric resonator sharing the piezoelectric substrate with the piezoelectric resonator of the main oscillator unit, and an auxiliary oscillator circuit connected to the auxiliary electrode;
   a temperature estimating unit detecting a frequency of an oscillation output of the auxiliary oscillator unit and estimating a temperature based on the frequency and a temperature characteristic of a frequency of the auxiliary oscillator unit; and
   a control voltage supply unit obtaining a control voltage for obtaining the set frequency signal based on the temperature estimated by the temperature estimating unit and a temperature characteristic of a frequency of the main oscillator unit and supplying the control voltage to the main oscillator circuit; and
   wherein the auxiliary oscillator unit comprises a first auxiliary electrode forming a first auxiliary vibration area, a second auxiliary electrode forming a second auxiliary vibration area, a first auxiliary oscillator circuit and a second auxiliary oscillator circuit connected to the first auxiliary electrode and the second auxiliary electrode, respectively, and a unit for obtaining a difference or a sum of respective oscillation frequencies of the first auxiliary oscillator circuit and the second auxiliary oscillator circuit so as to obtain an oscillation output of the auxiliary oscillator unit.

2. The piezoelectric oscillator according to claim 1, wherein a vibration wave used in the auxiliary oscillator unit is an overtone.

3. The piezoelectric oscillator according to claim 1, wherein a vibration mode of the auxiliary oscillator unit is contour shear vibration.

4. The piezoelectric oscillator according to claim 1, wherein a vibration mode of the main oscillator unit is thickness shear vibration.

5. The piezoelectric oscillator according to claim 1, wherein a vibration wave used in the main oscillator unit is an overtone.

6. A piezoelectric oscillator, comprising:
   a main oscillator unit for outputting a set frequency signal, the main oscillator unit comprising a piezoelectric resonator formed by providing a main electrode for forming a main vibration area on a piezoelectric substrate, and a main oscillator circuit connected to the main electrode;
   an auxiliary oscillator unit used as a temperature sensor, the auxiliary oscillator unit comprising a piezoelectric resonator formed by providing an auxiliary electrode for forming an auxiliary vibration area on the piezoelectric substrate used for the main oscillator unit separately from the main electrode, the piezoelectric resonator sharing the piezoelectric substrate with the piezoelectric resonator of the main oscillator unit, and an auxiliary oscillator circuit connected to the auxiliary electrode;
   a temperature estimating unit detecting a frequency of an oscillation output of the auxiliary oscillator unit and estimating a temperature based on the frequency and a temperature characteristic of a frequency of the auxiliary oscillator unit; and
   a control voltage supply unit obtaining a control voltage for obtaining the set frequency signal based on the temperature estimated by the temperature estimating unit and a temperature characteristic of a frequency of the main oscillator unit and supplying the control voltage to the main oscillator circuit; and
   wherein the auxiliary electrode is larger in weight than the main electrode.

7. A piezoelectric oscillator, comprising:

a main oscillator unit for outputting a set frequency signal, the main oscillator unit comprising a piezoelectric resonator formed by providing a main electrode for forming a main vibration area on a piezoelectric substrate, and a main oscillator circuit connected to the main electrode;

an auxiliary oscillator unit used as a temperature sensor, the auxiliary oscillator unit comprising a piezoelectric resonator formed by providing an auxiliary electrode for forming an auxiliary vibration area on the piezoelectric substrate used for the main oscillator unit separately from the main electrode, the piezoelectric resonator sharing the piezoelectric substrate with the piezoelectric resonator of the main oscillator unit, and an auxiliary oscillator circuit connected to the auxiliary electrode;

a temperature estimating unit detecting a frequency of an oscillation output of the auxiliary oscillator unit and estimating a temperature based on the frequency and a temperature characteristic of a frequency of the auxiliary oscillator unit; and a control voltage supply unit obtaining a control voltage for obtaining the set frequency signal based on the temperature estimated by the temperature estimating unit and a temperature characteristic of a frequency of the main oscillator unit and supplying the control voltage to the main oscillator circuit; and wherein the control voltage supply unit obtains a temperature compensation voltage with respect to a reference voltage which is a control voltage with which the main oscillator unit outputs a set frequency at a reference temperature, and adds the reference voltage and the temperature compensation voltage to obtain a control voltage.

8. The piezoelectric oscillator according to claim 6, wherein a vibration wave used in the auxiliary oscillator unit is an overtone.

9. The piezoelectric oscillator according to claim 6, wherein a vibration mode of the auxiliary oscillator unit is contour shear vibration.

10. The piezoelectric oscillator according to claim 6, wherein a vibration mode of the main oscillator unit is thickness shear vibration.

11. The piezoelectric oscillator according to claim 6, wherein a vibration wave used in the main oscillator unit is an overtone.

12. The piezoelectric oscillator according to claim 7, wherein a vibration wave used in the auxiliary oscillator unit is an overtone.

13. The piezoelectric oscillator according to claim 7, wherein a vibration mode of the auxiliary oscillator unit is contour shear vibration.

14. The piezoelectric oscillator according to claim 7, wherein a vibration mode of the main oscillator unit is thickness shear vibration.

15. The piezoelectric oscillator according to claim 7, wherein a vibration wave used in the main oscillator unit is an overtone.

* * * * *